United States Patent [19]
Kujirai et al.

[11] Patent Number: 5,744,225
[45] Date of Patent: Apr. 28, 1998

[54] HEAT INSULATING BOARD AND METHOD FOR HEAT INSULATION BY USING THE SAME

[75] Inventors: Yumiko Kujirai; Masami Kujirai; Yukio Kujirai, all of Warabi, Japan

[73] Assignee: Kabushiki Kaisha Sekuto Kagaku, Japan

[21] Appl. No.: 600,976

[22] PCT Filed: Sep. 2, 1994

[86] PCT No.: PCT/JP94/01459

§ 371 Date: Feb. 22, 1996

§ 102(e) Date: Feb. 22, 1996

[87] PCT Pub. No.: WO95/06839

PCT Pub. Date: Mar. 9, 1995

[30] Foreign Application Priority Data

Sep. 3, 1993 [JP] Japan .................. 5-243998

[51] Int. Cl.⁶ .................................................. B32B 9/00
[52] U.S. Cl. .................. 428/212; 428/98; 428/126; 428/192; 428/220; 428/325; 428/407; 428/426; 428/633; 428/649; 428/920; 427/409; 52/306; 52/309; 52/408; 52/553
[58] Field of Search .................. 428/426, 75, 212, 428/126, 192, 920, 325, 407, 633, 649, 220, 98; 427/409, 419.2, 419.1; 52/306, 408, 309, 553, 786.1

[56] References Cited

U.S. PATENT DOCUMENTS

| 5,030,504 | 7/1991 | Botsolas et al. . |
| 5,303,525 | 4/1994 | Magee ........................... 52/306 |

FOREIGN PATENT DOCUMENTS

| 1138525 | 6/1957 | France . |
| 85 22 410.3 | 2/1986 | Germany . |
| 1-152051 | 6/1989 | Japan . |
| 2-38159 | 10/1990 | Japan . |
| 4-71897 | 6/1992 | Japan . |
| 1107877 | 6/1968 | United Kingdom . |

*Primary Examiner*—Patrick Ryan
*Assistant Examiner*—Abraham Bahta
*Attorney, Agent, or Firm*—Wenderoth, Lind & Ponack

[57] ABSTRACT

A heat insulating board and a method for heat insulation by utilizing the same based on a novel heat-insulation theory utilizing a heat gradient. And, this heat insulating board is characterized by consisting of a composite body of an opaque heat-conducting base body positioned to face the low temperature zone and a heat conductive transparent layer positioned to face the high temperature zone, the said transparent layer having a heat volume and an absorption of heat of radiation smaller than the heat volume and absorption of heat of radiation of the said base body.

12 Claims, 2 Drawing Sheets

$T_H > T_L$ $T_H > T_L$

HEAT INSULATING BOARD AND METHOD FOR HEAT INSULATION BY USING THE SAME

TECHNICAL FIELD

The present invention relates to a novel heat insulating board or, to say more particularly, to a novel heat insulating board based on a novel heat insulation theory utilizing a heat gradient as well as a method for heat insulation by using the same.

BACKGROUND ART

In a closed space such as, for example, buildings and containers, it is usual to use various kinds of inorganic or organic heat insulating materials in order to shield transfer of heat from the inside to the outside or from the outside to the inside.

Inorganic heat insulating materials include, for example, glassy heat insulating materials such as glass fibers and foam glass, mineral-based heat insulating materials such as asbestos, slag wool, perlite and vermiculite, ceramic-based heat insulating materials such as porous silica, porous alumina, alumina, magnesia, zirconia and refractory bricks, carbonaceous heat insulating materials such as graphite and carbon fibers and so on while organic heat insulating materials include foamed plastics such as foamed polyethylenes, foamed polystyrenes and foamed polyurethanes, natural material-based heat insulating materials such as wooden boards, corks and plant fibers and so on.

Besides, air-layer heat insulating materials in which, by utilizing the low heat conductivity of gases such as air, they are sealed in aluminum, paper or plastic are also known.

These heat insulating materials serve to suppress transfer of heat by the use of a material which in itself has a low thermal conductivity or to suppress movement of heat by sealing a substance having low heat conductivity such as gases in pores or interstices.

Incidentally, however, it is known that, generally, the efficiency of heat insulation of a porous heat insulating material can be improved when the pores or interstices are increased so as to decrease the density leading to a decrease in the heat conductivity but an overly decrease of the density results in a decrease in the mechanical strength and in an increase of the heat transfer due to convection of the gas by the temperature elevation so that the approach of increasing the pores or interstices inherently has a limitation.

On the other hand, it is a due idea to enhance the effect of heat insulation by increasing the thickness of the heat insulating material though being accompanied by disadvantages in the practical point such as an increase in the cost due to the increase in the amount of the heat insulating material used, increase of the volume required for heat insulation and so on.

DISCLOSURE OF INVENTION

The present invention has been completed with an object to provide a heat insulating material, being entirely different from conventional heat insulating materials by the use of a material having low heat conductivity or by the use of a porous material with a decreased heat conductivity by sealing a gas such as air, based on a novel principle by which a heat gradient is formed from the surface facing the low temperature side toward the surface facing the high temperature side so as to prevent transfer of heat as well as a heat insulating method by the use thereof.

The inventors have conducted investigations on the mechanism for the heat transfer from a high temperature zone to a low temperature zone through a heat insulating board disposed between the high temperature zone and the low temperature zone to arrive at the discovery given below as a result.

That is, when heat is transferred by radiation or convection to the surface of a heat insulating board facing a high temperature zone, the heat on the surface facing the high temperature zone is transferred to the surface facing the low temperature zone in the mode of conduction. And, by being contacted with a low temperature fluid at the surface facing the low temperature zone, the heat is transferred to the low temperature fluid.

The temperature of the heat insulating board in contact with this low temperature fluid decreases more rapidly or more slowly as the total heat volume of the material constituting the heat insulation board is smaller or larger.

Accordingly, when a layer having a large total heat volume is provided on the surface of the heat insulating board facing the low temperature zone, a state of equilibration is established in this layer between the heat transferred from the heat insulating body and the heat carried away by the low temperature fluid so that, provided that the heat removed by convection is invariable, the temperature of the surface facing the low temperature zone is still more increased as compared with the original heat insulating board so that the transfer of heat through the heat insulating board from the surface facing the high temperature zone is prevented.

Following are numerical equations expressing the state of this heat flow.

$$q = \alpha_1(T_r - T_1) \quad \text{(I)}$$
$$= \lambda/L(T_1 - T_2) \quad \text{(I')}$$
$$= \alpha_0(T_2 - T_0) \quad \text{(I'')}$$

Therein, $q$ is the heat flow, $\alpha_1$ is the heat transfer coefficient of the fluid in the high temperature zone, $\alpha_0$ is the heat transfer coefficient of the fluid in the low temperature zone, $T_r$ is the temperature of the fluid in the high temperature zone, $T_1$ is the temperature of the surface of the heat insulating board facing the high temperature zone, $T_2$ is the temperature of the surface of the heat insulating board facing the low temperature zone, $T_0$ is the temperature of the fluid facing the low temperature zone, $\lambda$ is the heat conductivity of the heat insulating board and L is the thickness of the heat insulating board.

As is shown by this equation, heat flows from the fluid in the high temperature zone to the surface of the heat insulating board facing the high temperature side, flows through the inside of the heat insulating board by conduction and flows from the surface of the heat insulating board facing the low temperature zone to the fluid in the low temperature zone.

On the other hand, a body is subjected to transfer of heat by the incidence of sunlight, far infrared light generated secondarily and the like so that it is necessary to study also on the influence of these heats of radiation. Incidentally, when a heat insulating board disposed between the high temperature zone and the low temperature zone receives the heat of radiation, the heat insulating board absorbs the heat of radiation so that the temperature of the whole body is increased. And, while the surface facing the low temperature zone is kept at the low temperature due to perpetual contacting with the fluid at the low temperature, the temperature of the inside thereof such as the portion in the vicinity of the center in the direction of thickness is kept in a somewhat elevated state so that the temperature is succeedingly increased insofar as the absorption of heat of radiation is continued arriving at last at the same temperature as or a higher temperature than the temperature at the high temperature zone side leading to a result that the flow of heat from the surface facing the high temperature zone to the surface facing the low temperature zone is inhibited. And, this trend is more remarkable in a body having large absorption of the heat of radiation than in a body having small absorption of heat of radiation.

Accordingly, when a layer having larger absorption of heat of radiation than the heat insulating board is provided to the low temperature zone side of the heat insulating board, the absorption of heat of radiation in the whole body is increased so much that the flow of heat from the surface facing the high temperature zone to the surface facing the low temperature zone is inhibited.

Based on the above mentioned discovery, the inventors have conducted extensive investigations and, as a result, arrived at a finding that, when a heat insulating board is formed by laminating, on one surface of a non-transparent base board, a transparent layer consisting of a material having a smaller heat volume than and smaller absorption of heat of radiation than the base board to form a heat insulating board which is disposed with the transparent layer facing the high temperature zone, the heat insulating effect can be greatly improved as compared with a heat insulating board consisting of the base board alone leading to completion of the present invention.

Namely, the present invention provides a heat insulating board for shielding heat radiation from a high temperature zone to a low temperature zone by being disposed between the high temperature zone and the low temperature zone, which is a heat insulating board characterized by consisting of a composite body of an opaque heat-conductive base body to be positioned facing the low temperature zone and a heat-conductive transparent layer positioned to face the high temperature zone, the said transparent layer having a heat volume and absorptivity of radiation heat smaller than the heat volume and absorptivity of radiation heat of the said base body, as well as a method for heat insulation characterized in that a heat insulating board consisting of a composite body of an opaque heat-conductive base body and a heat-conductive transparent layer having a heat volume and absorptivity of radiation heat smaller than the heat volume and absorptivity of radiation heat of the base body is disposed between the high temperature zone and the low temperature zone such that the transparent layer is positioned to face the high temperature zone.

The heat volume here implied, referred to as Q, is a parameter defined by the following equation.

$$Q = V \cdot d \cdot C \quad \text{(II)}$$
$$= W \cdot C \quad \text{(II')}$$

Therein, C is the specific heat or, namely, the quantity of heat required to increase the temperature of the substance per unit weight (g) by 1° C. (cal/g/°C.), d is the density or, namely, the weight (g) per unit volume (cm$^3$) of the substance, V is the total volume of the substance (cm$^3$) and W is the total weight of the substance. The above mentioned specific heat C is inherent in each material and the numerical value thereof to be used in the present invention is, though varied depending on the temperature, the value obtained by the measurement using a conventional instrument for the measurement of specific heat at a temperature of the outer atmosphere.

And, the absorptivity of heat of radiation here implied is the proportion of the radiant temperature of the radiation from the heat source to the decrease in the temperature after the radiation from the heat source passes through a specified material expressed in percentage and the absorptivity of heat of radiation X in a specified material can be determined according to the following equation.

$$X=(T-T')/T \times 100 \quad \text{(III)}$$

Therein, T is the radiant temperature (°C.) of the radiation from the heat source and T' is the radiant temperature (°C.) of the radiation from the heat source after passing through the specified material.

Meanwhile, a body emits a large quantity of energy in the form of radiation at an increasing tempo as the temperature becomes higher and higher and the center wavelength ($\lambda_m$) of the highest intensity of the radiation emitted at the temperature is expressed by the following equation according to the Wien's law.

$$\lambda_m = b/T \quad \text{(IV)}$$

Therein, T is the absolute temperature.
The b here is a constant expressed by the equation below.

$$b = ch/\beta k$$

Therein, h is the Planck's constant, k is the Boltzmann's constant, c is the velocity in vacuum and $\beta$ is the root of the transcendent equation $e^{-\beta}+(\beta/5)-1=0$ and, by substitution with these numerical values, b is 2898 ($\mu$mK).

This leads to:

$$\lambda_m = 2898/T \quad \text{(IV')}$$

On the other hand, the energy incident on the body is, when the solid surface is opaque, partly absorbed by the solid surface, the remainder being reflected, so that the following equation is held.

$$\alpha\lambda + \rho\lambda = 1 \quad \text{(V)}$$

And, transparent materials such as glass permit transmission of light in the visible region and near infrared region but scarcely permit transmission of a wavelength longer than 2.5 $\mu$m so that the following equation is held.

$$\alpha\lambda + \rho\lambda + \tau\lambda = 1 \quad \text{(VI)}$$

Therein, $\alpha\lambda$ is the absorptivity, $\rho\lambda$ is the reflectivity and $\tau\lambda$ is the transmissivity.

Accordingly, the absorptivity of heat of radiation of a body depends, in the case of a closed region, on the wavelength of the highest intensity emitted at the temperature of the heat source existing therein.

Therefore, in the present invention, the absorptivity of heat of radiation to be used is that obtained by calculation with the above given equation (III) based on the surface temperature by the actual determination for each of the materials in the vicinity of the temperature for use.

BEST MODE FOR CARRYING OUT THE INVENTION

Figure 1:
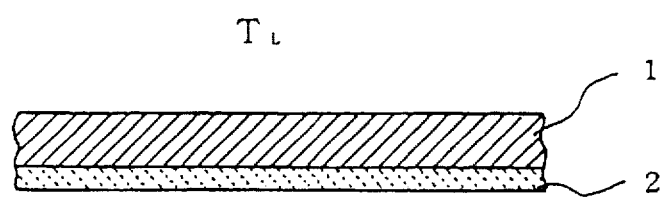
FIG. 1 is an enlarged cross sectional view illustrating an example of the structure of the heat insulating board of the present invention.

In the next place, description is given of the heat insulating board of the present invention by making reference to the accompanying drawing. FIG. 1 is an enlarged cross sectional view illustrating an example of the structure of the heat insulating board of the present invention, in which a transparent layer made from a heat-conductive material is laminated on the surface of a base body made from an opaque heat-conductive material facing the high temperature zone. And, the base body is disposed to face the low temperature zone at a temperature of $T_L$ and the transparent layer is disposed to face the high temperature zone at a temperature of $T_H$.

It is essential that this transparent layer has a heat volume and an absorption of heat of radiation smaller than those of the base body and it is preferable that the same has a heat volume not exceeding 10% or, preferably, not exceeding 5% of the heat volume of the base body and an absorption of heat of radiation not exceeding 60% or, preferably, not exceeding 50% of the absorption of heat of radiation of the base body.

The thickness of the base board in the present invention is in the range from 0.5 to 10 mm and the thickness of the transparent layer is in the range from 1 to 1000 μm although the thickness can be still larger when in use in a large-sized one as in a cold-insulation storehouse, large apparatus and the like and the thickness can be still smaller in the case of a small-sized one such as an electronic apparatus and the like.

In the present invention, the materials usable for the base board constituting the heat insulating board include non-transparent inorganic and organic materials such as metals, metal oxides, ceramics, plastics, rubbers and the like.

Examples of the metals among them include simple metals such as iron, aluminum, zinc, magnesium, gold, silver, chromium, germanium, molybdenum, nickel, lead, platinum, silicon, titanium, thorium and tungsten and alloys such as carbon steels, nickel steels, chromium steels, chromium-molybdenum steels, and bless steels, aluminum alloys, brass and bronze.

And, examples of the metal oxides include alumina, silica, magnesia, thoria, zirconia, diiron trioxide, triiron tetraoxide, titanium dioxide, calcium oxide, zinc oxide, lead oxide and the like and examples of the ceramics include opaque glass, chinas and porcelains, sintered silicon carbide, sintered silicon nitride, sintered boron carbide, sintered boron nitride and the like, respectively.

In the next place, examples of the plastics include acrylic resins, methacrylic resins, vinyl chloride resins, fluororesins, silicone resins, polyethylenes, polypropylenes, polystyrenes, AS resins, ABS resins, polyamides, polycarbonates, polyethylene terephthalates, polybutylene terephthalates, cellulose acetate resins, urea resins, melamine resins, phenolic resins, unsaturated polyester resins, epoxy resins, polyurethanes, polyvinyl butyrals, polyvinyl formals, polyvinyl acetates, polyvinyl alcohols, ionomers, chlorinated polyethers, ethylene-α-olefin copolymers, ethylene-vinyl chloride copolymers, ethylenevinyl acetate copolymers, chlorinated polyethylenes, vinyl chloride-vinyl acetate copolymers, polyphenylene oxides, polyphenylene sulfides, polyaryl sulfones, polyether-ether ketones and the like and examples of the rubbers include natural rubber, butadiene rubbers, isoprene rubbers, chloroprene rubbers, butyl rubbers, silicone rubbers, urethane rubbers and the like, respectively. When they are used as the base body, it is essential that they are rendered non-transparent by compounding with fillers, coloring agents and the like.

Besides, ores such as granites, marbles and the like, ceramic products such as bricks, concretes and the like, woods such as Japanese cedar, pine tree, Japanese cypress and the like, fibrous products such as cotton cloth, linen cloth, kapok cloth, paper and the like, leathers and so on can also be used according to desire.

It is preferable to use, as the transparent layer constituting the present invention, a plastic having transparency in the infrared region. Generally speaking, the atoms constituting the plastic each have an absorption wavelength of infrared light depending on the state of bonding and the principal absorption wavelengths are found in the range from 7.5 to 12.5 μm for the single bond of C—C, C—O and C—N, in the range from 5.5 to 6.5 μm for the double bond of C=C, C=O, C=N and N=O and in the range from 4.5 to 5.0 μm for the triple bond of C≡C and C≡N, little absorption being found in other ranges exhibiting high transparency.

On the other hand, as is mentioned before, the infrared light emitted from the heat source is emitted with wavelengths in a wide range with the wavelength region having the highest intensity at the center depending on the temperature of the heat source. For example, the principal wavelength in the case of sunlight is about 0.5 μm but the wavelength region to serve as the heat source is approximately from 0.34 to 25 μm and the principal wavelength at the ground temperature of 19° C. is about 10 μm but the wavelength region emitted therefrom is approximately in the range from 7 to 13 μm.

Accordingly, when a material having absorption in the infrared region such as metals, opaque glass, opaque plastics, wood, concrete, brick and marble is used for the base body, the transparent layer can be freely selected among transparent plastics having smaller absorption than that.

And, in the case of a radiation of which the temperature of the heat source is 200° C. or below and the principal wavelength does not exceed about 6 μm, it is preferable to use a transparent plastic exhibiting small absorption in the region of the wavelength of 4 μm or smaller such as, for example, polyethylene, polypropylene, polyisobutylene, polystyrene, polyvinyl acetate, ethylene-vinyl acetate copolymers, polyvinyl alcohol, polyvinyl chloride, vinyl chloride-vinylidene chloride copolymers, polyacrylonitrile, polyvinyl pyrrolidone, polyacrylic acid, polymethyl methacrylate, methyl methacrylate-styrene copolymers, polybutyl methacrylate, silicone resins, butadiene rubber, butyl rubber, chloroprene rubber and the like as well as a blend thereof.

And, when the temperature of the heat source is a high temperature as high as about 5727° C. as in the sunlight and the radiation has the principal wavelength of about 0.5 μm, it is preferable to use a transparent plastic exhibiting a small absorption in the region of the wavelength of 0.3 to 2.5 μm such as, for example, polystyrene, polyvinyl acetate, polyvinyl chloride, polycarbonate, polyethylene terephthalate, polybutylene terephthalate, cellulose acetate, diallyl phthalate resin, urea resin, melamine resin, polyvinyl butyral, vinyl chloride-vinyl acetate copolymers, ethylene-α-olefin copolymers, ethylene-vinyl acetate copolymers, ethylenevinyl chloride copolymers, acrylic acid-vinyl chloride copolymers, polymethylpentene, polytetrafluoroethylene, polychlorotrifluoroethylene, polyvinyl pyrrolidone, polymethyl methacrylate, methyl methacrylate-styrene copolymers, polybutyl methacrylate, nylon-66, epoxy resin, silicone resin, butadiene-styrene resin, polysulfone, polyvinylidene fluoride, MBS resin, polybutadiene, polyether sulfone and the like as well as a blend thereof.

Incidentally, temperature of a body is increased by absorbing much of the radiation in the vicinity of the principal wavelength emitted from a heat source. And, a base body consisting of an opaque material absorbs the radiation over the almost whole wavelength region so that, by selecting a material having small absorption and high transmissivity in the vicinity of the principal wavelength generated in the heat source for the transparent layer, the base body can absorb more of the heat of radiation so as to decrease the temperature gradient between the base body and the transparent layer and to cause a delay in the heat transfer from the surface facing the high temperature zone to the surface facing the low temperature zone.

According to the Lambert-Beer's law, absorption of light can be increased by increasing the thickness of the substance to absorb the light.

Accordingly, when the materials used are assumed to have the same absorption of heat of radiation, it is possible further to decrease the absorption of the heat of radiation and to increase the transmissivity by decreasing the thickness thereof. And, even an opaque substance can be used as the transmitting layer by decreasing the thickness thereof because of the enabled transmission of the heat of radiation.

The form of the heat insulating board of the present invention is not particularly limitative and can be shaped in any desired form including square, circle, cylinder, semisphere, sphere and the like and it can be worked to have a surface form including surface with undulation, surface with ruggedness, surface with protrusions and the like.

The method for lamination of a base body of glass and a transparent layer in the present invention can be freely selected among the methods conventionally used heretofore for laminating other materials onto a base board including a method in which a transparent layer shaped in advance in the form of a film or in the form of a sheet is applied and bonded to the surface of the base body by hot-melt bonding or adhesive bonding, a method in which a plastic is dissolved in a suitable solvent and applied to the base body followed by drying and solidification, a method in which firm bonding is effected by the chemical vapor-phase deposition, vacuum vapor-phase deposition, electroless plating and the like, and so on.

Different from prior art heat insulating boards by utilizing an insulating material capable of suppressing conduction of heat, the heat insulating board of the present invention utilizes a heat gradient so that it is essential that the base body and the transparent layer have thermal conductivity.

FIG. 1 illustrates an example where the base body and the transparent layer are each a unitary body and, in the present invention, the base body or transparent layer or both can be constructed also as a composite body. As to each of the base bodies and each of the transparent layers, in this case, it is essential that a relationship is satisfied that the heat volume and the absorption of heat of radiation of that facing the high temperature zone are smaller than those of that facing the low temperature zone. And, in this case, it is desirable to constitute in such a way that the innermost transparent layer or, namely, the transparent layer forming the surface facing the high temperature zone has a heat volume not exceeding 10% or, preferably, not exceeding 5% of the heat volume of the outermost base board or, namely, the base body forming the surface facing the low temperature zone and absorption of heat of radiation not exceeding 60% or, preferably, not exceeding 50% of the absorption of heat of radiation of the base body.

The heat insulating board of the present invention can be used in combination with a conventional heat insulating material such as foamed styrene, foamed urethane and the like.

Heat insulation between a high temperature zone and a low temperature zone by using the heat insulating board of the present invention can be performed by forming a part or whole of the partition wall provided between both with the heat insulating board disposed in such a fashion that the base board faces the low temperature zone.

In this way, transfer of heat by conduction directed toward the low temperature zone side from the high temperature zone through the partition wall is inhibited by the heat gradient formed in the reverse direction and the heat of radiation from the high temperature zone side is absorbed by the base body having a larger absorption of the heat of radiation than that after transmission through the transparent layer to increase the temperature of the base body resulting in further inhibition of heat conduction to exhibit an effect of heat insulation.

Thus, the heat insulating board of the present invention can be effectively utilized as a ceiling material, wall material and flooring material of living houses and cold-keeping storehouses, base material of various kinds of vessels and the like.

In the following, the present invention is described in further detail by way of examples.

EXAMPLE 1

Two cubic boxes (50×50×50 cm) having a single open side surface were prepared from foamed styrene boards of 5 mm thickness and a heat insulating board (A) consisting of a single iron plate of 1 mm thickness alone (heat volume 216.4 cal/°C., absorptivity of heat of radiation 98%) was mounted onto the open side of one of the boxes and another heat insulating board (B) prepared by laminating a transparent layer of 5 µm thickness of a methyl methacrylate-ethyl acrylate-styrene copolymer (heat volume 0.5 cal/°C., absorptivity of heat of radiation 30%) onto the outside surface of the same iron plate was mounted onto the open side of the other box.

In the next place, these boxes were heated from outside with an infrared heater to increase the inside temperature up to 55° C. followed by interruption of heating and, while blowing cooled air at 16° C. from an air conditioner installed at a position apart from the heat insulation board by about 1.2 meters, change of the inside temperature was recorded in the lapse of time.

Figure 2:
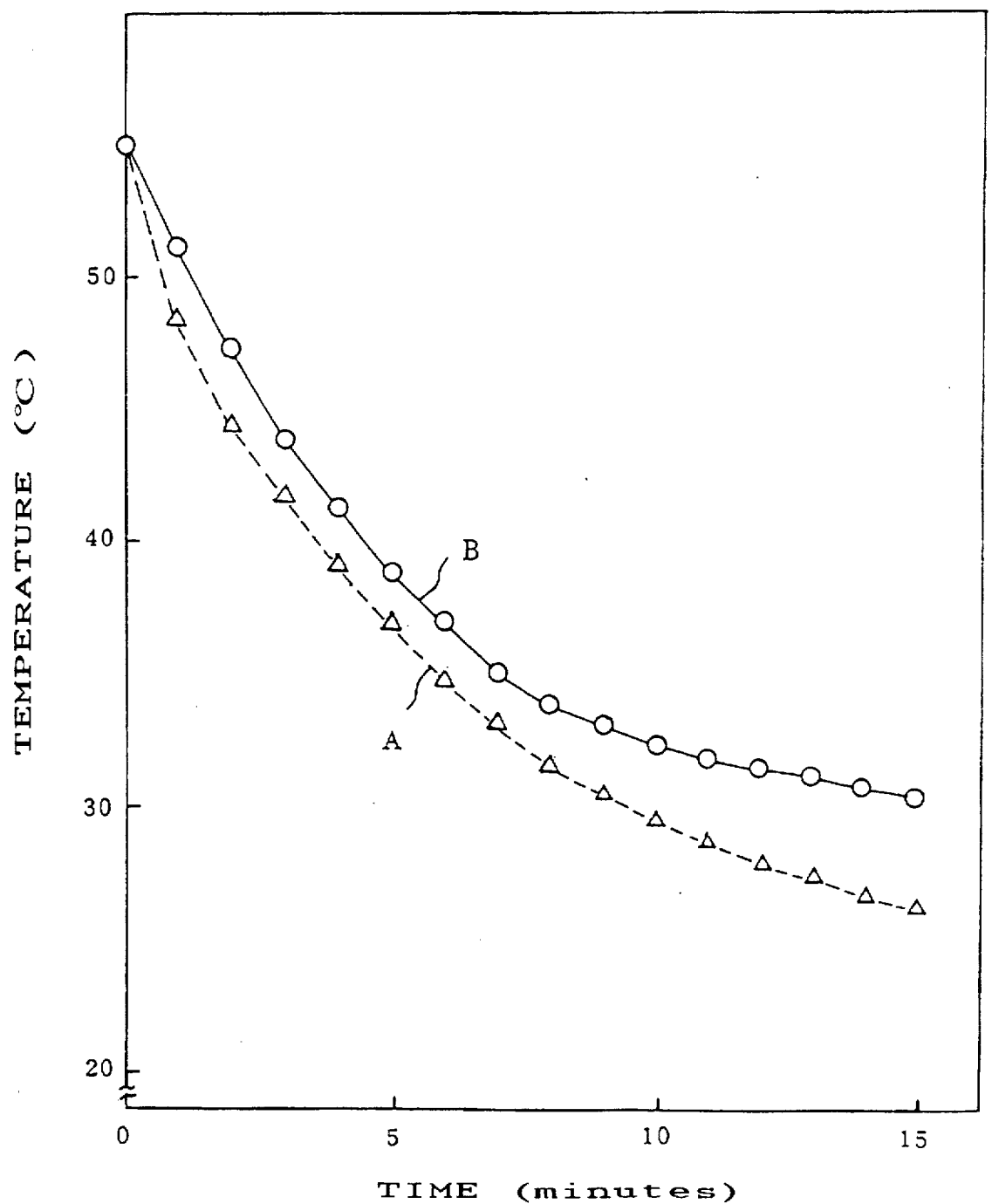
FIG. 2 is a graph showing the difference in the heat insulating effect between the heat insulating board of the present invention and a conventional iron plate.

The results are shown in FIG. 2 as a graph with the broken line (A) and the solid line (B).

EXAMPLE 2

Two square windows each 1 meter high and 1 meter wide were installed in a room of 44 m³ capacity and a black glass plate of 3 mm thickness (heat volume 1500 cal/°C., absorptivity of heat of radiation 95%) was mounted on one of them while a heat insulating board prepared by laminating a transparent layer of 5 µm thickness consisting of a copolymer of ethyl acrylate, methyl methacrylate and styrene (heat volume 2.0 cal/°C., absorptivity of heat of radiation 30%) onto the inwardly facing surface of the same black glass plate was mounted to the other to measure the temperature change on the inwardly facing surfaces and outwardly facing surfaces of the glass pane and the heat insulating board in the lapse of time during night under working of a hot-air room warmer of 2300 kcal/hour. The results are shown in Table 1.

TABLE 1

| Lapse of time (minutes) | 0 | 5 | 10 | 15 | 20 | 25 | 30 | 35 | 40 |
|---|---|---|---|---|---|---|---|---|---|
| Outdoor temperature (°C.) | 10.9 | 10.9 | 10.8 | 10.9 | 10.9 | 10.8 | 10.7 | 10.6 | 10.7 |
| Indoor temperature (°C.) | 14.0 | 17.5 | 17.8 | 18.3 | 18.5 | 18.6 | 18.6 | 18.4 | 18.4 |
| Temperature of surface facing outdoors (°C.) | | | | | | | | | |
| (Glass pane) | 11.8 | 12.6 | 13.0 | 13.2 | 13.3 | 13.5 | 13.9 | 13.9 | 13.6 |
| (Heat insulating board) | 11.8 | 12.5 | 12.7 | 13.1 | 13.1 | 13.2 | 13.3 | 13.2 | 13.2 |
| Temperature of surface facing indoors (°C.) | | | | | | | | | |
| (Glass pane) | 12.0 | 13.0 | 13.5 | 14.1 | 14.4 | 14.3 | 14.6 | 14.9 | 14.7 |
| (Heat insulating board) | 11.5 | 12.2 | 12.7 | 13.0 | 13.2 | 13.2 | 13.3 | 13.2 | 13.2 |

It is understood from this table that, while a decrease the surface temperature by about 0.2° to 1.1° C. was found the glass pane on the surface facing the outdoor as compared with that facing inside of the room, almost no decrease was found in the heat insulating board.

EXAMPLE 3

A heat insulating board was prepared by forming a coating film of 5 μm thickness by coating the inwardly facing surface of the same black glass plate as used in Example 2 with a solution of a vinyl chloride resin dissolved in acetone. The heat volume thereof was 1.9 cal/°C. and the absorptivity of heat of radiation was about 44%.

The same experiment as in Example 2 was undertaken by using this heat insulating board. The results are shown in Table 2.

TABLE 2

| Lapse of time (minutes) | 0 | 5 | 10 | 15 | 20 | 25 | 30 | 35 | 40 |
|---|---|---|---|---|---|---|---|---|---|
| Outdoor temperature (°C.) | 11.2 | 11.2 | 11.1 | 11.3 | 11.2 | 11.0 | 11.1 | 11.2 | 11.1 |
| Indoor temperature (°C.) | 14.0 | 17.6 | 17.8 | 18.5 | 18.6 | 18.8 | 18.8 | 18.9 | 18.7 |
| Temperature of surface facing outdoors (°C.) | | | | | | | | | |
| (Glass pane) | 11.9 | 12.8 | 13.0 | 13.3 | 13.6 | 13.6 | 13.9 | 14.1 | 14.0 |
| (Heat insulating board) | 11.8 | 12.7 | 12.6 | 13.0 | 13.3 | 13.4 | 13.4 | 13.5 | 13.5 |
| Temperature of surface facing indoors (°C.) | | | | | | | | | |
| (Glass pane) | 12.2 | 13.3 | 13.5 | 14.1 | 14.5 | 14.6 | 15.0 | 15.2 | 15.1 |
| (Heat insulating board) | 11.6 | 12.4 | 12.5 | 13.1 | 13.2 | 13.4 | 13.4 | 13.5 | 13.5 |

It is understood from this table that, while a decrease in the surface temperature by about 0.3° to 1.1° C. was found in the glass pane on the surface facing the outdoor atmosphere as compared with that facing inside of the room, almost no decrease was found in the heat insulating board.

EXAMPLE 4

A heat insulating board was prepared by forming a coating film of 5 μm thickness by coating the same black glass plate as used in Example 2 with a solution of a copolymer of vinyl chloride and vinyl acetate dissolved in acetone. The heat volume of this coating film was 1.92 cal/°C. and the absorptivity of heat of radiation was 53%.

The same experiment as in Example 2 was undertaken by using this heat insulating board. The results are shown in Table 3.

TABLE 3

| Lapse of time (minutes) | 0 | 5 | 10 | 15 | 20 | 25 | 30 | 35 | 40 |
|---|---|---|---|---|---|---|---|---|---|
| Outdoor temperature (°C.) | 10.8 | 10.8 | 10.7 | 10.6 | 10.7 | 10.7 | 10.5 | 10.6 | 10.6 |
| Indoor temperature (°C.) | 13.9 | 17.5 | 17.7 | 17.8 | 18.3 | 18.5 | 18.6 | 18.5 | 18.5 |
| Temperature of surface | | | | | | | | | |

TABLE 3-continued

| Lapse of time (minutes) | 0 | 5 | 10 | 15 | 20 | 25 | 30 | 35 | 40 |
|---|---|---|---|---|---|---|---|---|---|
| facing outdoors (°C.) | | | | | | | | | |
| (Glass pane) | 11.8 | 12.6 | 13.0 | 13.1 | 13.2 | 13.3 | 13.4 | 13.6 | 13.6 |
| (Heat insulating board) | 11.8 | 12.5 | 12.7 | 13.0 | 13.0 | 13.1 | 13.1 | 13.2 | 13.2 |
| Temperature of surface facing indoors (°C.) | | | | | | | | | |
| (Glass pane) | 11.9 | 13.0 | 13.4 | 13.8 | 14.1 | 14.1 | 14.3 | 14.5 | 14.5 |
| (Heat insulating board) | 11.7 | 12.5 | 12.7 | 12.9 | 13.0 | 13.2 | 13.2 | 13.3 | 13.4 |

It is understood from this table that, while a decrease in the surface temperature by about 0.1° to 0.9° C. was found in the glass pane on the surface facing the outdoor surface as compared with that facing inside of the room, almost no decrease was found in the heat insulating board.

Comparative Example

A heat insulating board was prepared by providing a melamine resin layer of 5 μm thickness on the same black glass plate as used in Example 2. The heat volume of this melamine resin layer was 1.86 cal/°C. and the absorptivity of heat of radiation was 68%.

The same experiment as in Example 2 was undertaken by using this heat insulating board and the results are shown in Table 4.

TABLE 4

| Lapse of time (minutes) | 0 | 5 | 10 | 15 | 20 | 25 | 30 | 35 | 40 |
|---|---|---|---|---|---|---|---|---|---|
| Outdoor temperature (°C.) | 11.1 | 11.2 | 11.2 | 11.0 | 11.0 | 10.9 | 10.9 | 10.8 | 10.8 |
| Indoor temperature (°C.) | 14.0 | 17.6 | 17.8 | 18.4 | 18.5 | 18.7 | 18.7 | 18.8 | 18.7 |
| Temperature of surface facing outdoors (°C.) | | | | | | | | | |
| (Glass pane) | 11.8 | 12.9 | 13.1 | 13.2 | 13.4 | 13.5 | 13.4 | 13.5 | 13.5 |
| (Heat insulating board) | 11.8 | 12.9 | 13.2 | 13.2 | 13.5 | 13.5 | 13.6 | 13.5 | 13.4 |
| Temperature of surface facing indoors (°C.) | | | | | | | | | |
| (Glass pane) | 12.2 | 13.5 | 13.6 | 14.0 | 14.3 | 14.5 | 14.5 | 14.6 | 14.6 |
| (Heat insulating board) | 12.1 | 13.5 | 13.6 | 14.2 | 14.4 | 14.4 | 14.5 | 14.5 | 14.7 |

It is understood from this table that almost no heat insulating effect can be obtained when the absorption of heat of radiation of the transparent layer to be laminated is not 60% or less of the absorption of heat of radiation of the base body.

EXAMPLE 5

Two of the same cubic box made of foamed styrene as used in Example 1 were prepared.

A zinc-plated iron plate of 1 mm thickness (heat volume 216.4 cal/°C., absorptivity of heat of radiation 95%) was mounted onto the open side of one of the boxes and a heat insulating board prepared by forming a transparent layer of a varied thickness by coating the same iron plate with a copolymer of ethyl acrylate, methyl methacrylate and styrene dissolved in a solvent mixture of toluene and ethyl acetate was mounted onto the open side of the other box with the transparent layer facing inwardly.

In the next place, an infrared lamp of 125 watts covered with a black cloth was placed inside of each to effect heating and the change of the inside temperature thereof was examined in the lapse of time. The results are shown in Table 5.

TABLE 5

| Sample No. | Thickness of transparent layer (μm) | $\frac{X_1}{X_2} \times 100$ | 0 | 1 | 2 | 3 | 4 | 5 | 10 | 30 | 60 | 90 |
|---|---|---|---|---|---|---|---|---|---|---|---|---|
| | | | | | | Lapse of time (minutes) | | | | | | |
| 1 | 5 | 0.23 | 20.3 | 26.1 | 34.2 | 40.9 | 51.5 | 59.0 | 90.2 | 93.5 | 93.8 | 95.2 |
| 2 | 10 | 0.46 | 20.2 | 26.1 | 34.5 | 40.7 | 51.4 | 58.9 | 90.2 | 92.2 | 92.6 | 93.2 |
| 3 | 50 | 2.3 | 20.2 | 25.3 | 32.3 | 38.1 | 48.5 | 54.5 | 88.2 | 89.3 | 89.5 | 90.1 |

TABLE 5-continued

| Sample No. | Thickness of transparent layer (μm) | $\frac{X_1}{X_2} \times 100$ | 0 | 1 | 2 | 3 | 4 | 5 | 10 | 30 | 60 | 90 |
|---|---|---|---|---|---|---|---|---|---|---|---|---|
| 4 | 100 | 4.6 | 20.3 | 25.5 | 32.8 | 38.9 | 48.9 | 55.3 | 86.5 | 86.7 | 86.3 | 86.4 |
| 5 | 150 | 6.9 | 20.1 | 25.1 | 32.4 | 37.6 | 48.7 | 54.7 | 83.1 | 84.1 | 84.3 | 83.9 |
| 6 | 200 | 9.2 | 20.3 | 25.2 | 31.2 | 37.3 | 46.6 | 53.0 | 77.3 | 77.6 | 77.7 | 78.3 |
| 7 | 220 | 10.1 | 20.2 | 24.9 | 29.9 | 36.8 | 43.5 | 50.5 | 76.5 | 76.5 | 77.2 | 77.8 |
| 8 | None | — | 20.2 | 24.8 | 30.0 | 36.7 | 43.4 | 50.1 | 75.2 | 76.2 | 76.8 | 76.9 |

Note) In the table, $X_1$ is the heat volume of the transparent layer and $X_2$ is the heat volume of the zinc-plated iron plate.

It is understood from this table, the increase in the inside temperature is faster as the heat volume of the transparent layer is smaller to exhibit an excellent heat insulating effect.

EXAMPLE 6

Using two rooms of the same type (volume 17.25 m³ and area of window 1.40 m²) on the 8th floor of an eleven-storied ferroconcrete building, a zinc-plated iron plate of 1 mm thickness (heat volume 1211 cal/°C., absorptivity of heat of radiation 95%) was mounted on the window of one and a heat insulating board provided with a transparent layer (heat volume 2.8 cal/°C., absorptivity of heat of radiation 30%) formed by coating the surface of the same iron plate facing inside with a copolymer of ethyl acrylate, methyl methacrylate and styrene in a thickness of 5 μm was mounted on the window of the other and, in a night absolutely without incidence of sunlight, the changes of the temperature in the lapse of time were recorded for each of the rooms while heating with a hot-air room warmer of 2300 kcal/hour. The results are shown in Table 6.

TABLE 6

| Lapse of time (hours) | 0 | 1 | 2 | 3 | 4 | 5 | 6 |
|---|---|---|---|---|---|---|---|
| Outdoor temperature (°C.) | 10.1 | 9.8 | 9.9 | 10.0 | 8.6 | 8.2 | 8.2 |
| Indoor temperature (°C.) | | | | | | | |
| Iron plate | 17.5 | 19.5 | 20.2 | 20.5 | 21.0 | 21.2 | 21.3 |
| Heat insulating board | 17.8 | 21.0 | 22.1 | 23.0 | 23.8 | 24.3 | 24.6 |

It is understood from this table that the room on which the heat insulating board was mounted maintained higher temperatures to exhibit an effect of heat insulation.

INDUSTRIAL APPLICABILITY

According to the present invention, it is not necessary to increase the thickness as in the conventional heat insulating boards using a foamed material by merely laminating a transparent layer of a small thickness onto one surface of an opaque material when formation of a heat gradient is utilized so that it can be used satisfactorily for use as a partition wall in living houses, cold-keeping storehouses, cold-keeping vehicles, warm-keeping vessels and the like.

We claim:

1. A heat insulating board for shielding heat dissipation from a high temperature zone to a low temperature zone by being disposed between the high temperature zone and the low temperature zone, said board consisting essentially of a composite body of an opaque heat-conducting base body positioned to face the low temperature zone and a heat conductive transparent layer positioned to face the high temperature zone, the said transparent layer having a heat volume and an absorption of heat of radiation smaller than the heat volume and absorption of heat of radiation of the said base body.

2. The heat insulating board described in claim 1 in which the heat volume of the transparent layer does not exceed 10% of the heat volume of the base body and the absorption of heat of radiation of the transparent layer does not exceed 60% of the absorption of heat of radiation of the base body.

3. A method for heat insulation characterized in that a heat insulating board consisting essentially of a composite body of an opaque heat-conductive base body and a heat-conductive transparent layer having a heat volume and an absorption of heat of radiation smaller than the heat volume and the absorption of heat of radiation of the base body is disposed between a high temperature zone and a low temperature zone in such a fashion that the transparent layer faces the high temperature zone.

4. The method for heat insulation described in claim 3 in which the heat volume of the transparent layer does not exceed 10% of the heat volume of the base body and the absorption of heat of radiation of the transparent layer does not exceed 60% of the absorption of heat of radiation of the base body.

5. The heat insulating board according to claim 1, wherein said opaque heat-conducting base body includes non-transparent organic or inorganic materials, and said transparent layer includes a plastic having transparency in the infrared region.

6. The heat insulating board according to claim 5, wherein said non-transparent organic or inorganic materials are metals, metal oxides, ceramics, plastics or rubbers.

7. The method according to claim 3, wherein said opaque heat-conductive base body contains non-transparent inorganic or organic materials, and said transparent layer includes a plastic having transparency in the infrared region.

8. The method according to claim 7, wherein said non-transparent inorganic or organic materials are metals, metal oxides, ceramics, plastics or rubbers.

9. The heat insulating board according to claim 1, wherein the heat-insulating body consists of an iron plate laminated to a transparent layer of methyl methacrylate-ethyl ethacrylate-styrene copolymer.

10. The method according to claim 3, wherein the heat insulating board consists of an iron plate laminated to a transparent layer of a methyl methacrylate-ethyl ethacrylate-styrene copolymer.

11. The heat insulating board according to claim 1, wherein the composite body consists of a black glass plate laminated to a transparent layer of ethyl acrylate-methyl methacrylate-styrene copolymer.

12. The method according to claim 3, wherein said heat insulating board consists of a black plate laminated to a transparent layer of ethyl ethacrylate-methyl methacrylatestyrene copolymer.

* * * * *